United States Patent [19]
Nagabushnam et al.

[11] Patent Number: 6,001,726
[45] Date of Patent: Dec. 14, 1999

[54] METHOD FOR USING A CONDUCTIVE TUNGSTEN NITRIDE ETCH STOP LAYER TO FORM CONDUCTIVE INTERCONNECTS AND TUNGSTEN NITRIDE CONTACT STRUCTURE

[75] Inventors: Rajan Nagabushnam; Rajeev Bajaj; Ram Venkataraman; Shyam Mattay; Subramoney V. Iyer, all of Austin, Tex.

[73] Assignee: Motorola, Inc., Schaumburg, Ill.

[21] Appl. No.: 08/822,670

[22] Filed: Mar. 24, 1997

[51] Int. Cl.$^6$ .............................................. H01L 21/4763
[52] U.S. Cl. ...................... 438/618; 438/622; 438/626; 438/629; 438/630; 438/634; 438/637; 438/648; 438/649; 438/656; 438/685; 438/682; 438/683; 438/785
[58] Field of Search .................................. 438/618, 622, 438/626, 629, 630, 634, 637, 648, 649, 656, 685, 682, 683, 785

[56] References Cited

U.S. PATENT DOCUMENTS

| | | | |
|---|---|---|---|
| 4,844,776 | 7/1989 | Lee et al. | 156/653 |
| 5,219,793 | 6/1993 | Cooper et al. | 437/195 |
| 5,847,463 | 12/1998 | Trivedi et al. | 257/751 |
| 5,888,588 | 3/1999 | Nagabushnam et al. | 427/248.1 |
| 5,907,188 | 5/1999 | Nakajima et al. | 257/751 |
| 5,937,300 | 8/1999 | Sekine et al. | 438/300 |

OTHER PUBLICATIONS

K.H.Kuesters et al, "Self Aligned Bitline Contact for 4 MBIT DRAM", Proceedings of First Int'l.Sym. on ULSI Science/Technology, vol. 87–11, Electrochemical Society, NJ, pp. 640–649.

*Primary Examiner*—John F. Niebling
*Assistant Examiner*—Lynne A. Gurley
*Attorney, Agent, or Firm*—Keith E. Witek

[57] ABSTRACT

A method for forming a contact structure (10) which enables the use of ultra-shallow source/drain junctions begins by forming source and drain regions (14) and gate electrode (16). The source and drain regions (14) and the gate electrode (16) are silicided to form silicide regions (20). A conductive tungsten nitride etch stop layer (22) is formed overlying the silicide regions (20). Contact plug regions (28) are then formed to contact to the etch stop layer (22) and silicided regions (20). At this point, all of the silicide regions (20) are electrically short circuited. To remove this electric short circuit, an isotropic etch process comprising hydrogen peroxide, ammonium hydroxide, and water is used to remove portions of the tungsten nitride regions which are between the individual contact portions (28) in a self-aligned manner.

19 Claims, 3 Drawing Sheets

METHOD FOR USING A CONDUCTIVE TUNGSTEN NITRIDE ETCH STOP LAYER TO FORM CONDUCTIVE INTERCONNECTS AND TUNGSTEN NITRIDE CONTACT STRUCTURE

FIELD OF THE INVENTION

The present invention relates generally to semiconductor manufacturing, and more particularly to using a metallic etch stop layer to form conductive interconnects.

BACKGROUND OF THE INVENTION

Semiconductor manufacturers are continually trying to achieve shallow junctions to control the threshold voltage ($V_T$) and transconductance. However, a problem in forming such shallow junctions is the ability to etch a dielectric layer which overlies the junction region without damaging the junction region. In etching an opening in the dielectric layer, the junction region is exposed, and can be physically or chemically attacked. If the junction is too shallow, the dielectric etch will damage the junction region, and in the worst case completely punch through the junction region rendering the device inoperable due to substrate electrical short-circuiting.

One known solution to help alleviate the problems of junction breakthrough is to use a plasma enhanced nitride (PEN) as an etch stop layer when forming contacts and local interconnects. This blanket etch stop layer is deposited across the entire semiconductor substrate. This PEN layer is deposited prior to the first interlayer dielectric material. In etching local interconnect or contact openings in the interlayer dielectric, the PEN layer serves as an etch stop over the junctions. Contacts are formed to both the substrate (source and drain) and the gate electrode regions. The bottom-most layer of the contact structure is usually silicon substrate or field/trench isolation regions. The top most contacted regions are the gate electrodes. The presence of the PEN etch stop layer prevents the top polysilicon member from being exposed to the interlayer dielectric etch while the etch is still in progress to remove the interlayer dielectric over the junction/substrate regions. However, the PEN etch stop layer above the junctions in polysilicon regions nonetheless has to be removed to make electrical contacts to the gate and substrate members. In removing the PEN etch stop layer in these areas, there is still the risk that the etch of the PEN layer will result in junction punch-through.

Silicide regions are often formed over the junction regions and polysilicon members to improve contact resistance. In the past, such silicide regions have been somewhat effective in preventing junction punch-through. However, as junctions become more shallow, the silicide regions become thinner, and the silicide regions are proving less than effective in preventing junction punch-through.

Accordingly, there is a need in the semiconductor industry for a method for forming shallow junctions in semiconductor devices.

Figure 1:
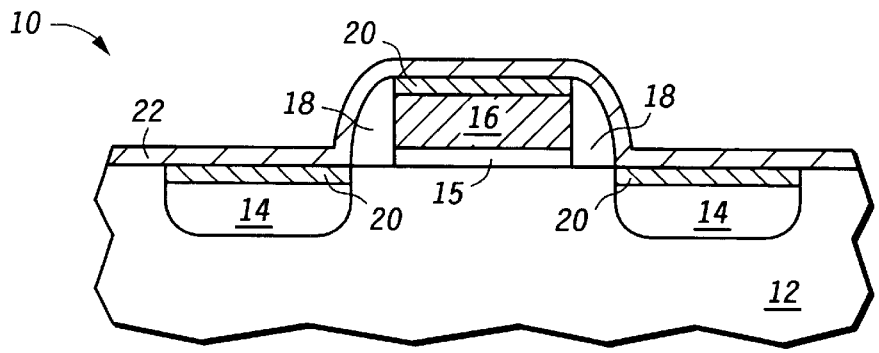
FIGS. 1 through 7 illustrate in partial cross-sectional views a portion of a semiconductor device as it is processed using a conductive etch stop layer to enable shallow junction formation in accordance with one embodiment of the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is a method for utilizing a metallic etch stop layer to form conductive interconnect structures. These conductive interconnect structures, due to the added etch protection provided by the metallic etch stop layer, can be used to contact source and drain electrodes having ultra-shallow junction depths and polysilicon gate electrodes at different vertical heights above the substrate surface. Generally, the process begins by providing a substrate 12. A polysilicon or amorphous silicon gate electrode 16 is formed overlying the substrate 12. Self-aligned source and drain electrodes 14 are ion implanted laterally adjacent at the gate electrode 16. A blanket layer of a refractory metal, such as cobalt or titanium, is sputtered onto the surface of the wafer. A thermal process is used to form silicide regions 20 overlying the source and drain electrodes 14 and the gate 16 using the sputtered metal layer as a refractory metal source. Any excess unsilicided refractory metal material is then stripped from the wafer via an etch process.

After this step of stripping excess refractory metal, a layer of conductive tungsten nitride 22 is formed on the wafer. This layer of conductive tungsten nitride 22 temporarily electrically short circuits all of the silicide regions 20. Metallic etch stops are usually not used for contact processing due to this electrical short-circuit reason. However, a subsequent self-aligned tungsten nitride removal process is used to subsequently remove the short-circuits rendering an electrically functional device in a manner which does not adversely impact minimum design rule constraints due to the self-aligned nature of the etch. A BPSG layer 24 is then formed overlying the conductive tungsten nitride layer 22. Openings are patterned through the BPSG layer 24 to expose portions of the tungsten nitride layer 22 which overlie the silicide regions 20. During this etch process, the tungsten nitride functions as an etch stop layer which protects the underlying silicide regions and shallow source/drain junctions from etch damage.

After formation of the contact openings, a conductive interconnect is formed within the contact openings using a glue layer 26 and tungsten material 28. A chemical/mechanical polishing (CMP) step is utilized to form conductive plug regions from the tungsten layer 28. After this CMP process, the dielectric layer 24 is removed to expose the electrically short-circuiting portions of the conductive tungsten nitride 22. These electrical short circuiting portions of the layer 22 are then etched using a hydrogen peroxide, ammonium hydroxide, and water isotropic etch chemistry. Due to this self-aligned isotropic etch process, the silicide regions 20 are no longer electrically short-circuited to each other. The now free standing "pillar" contact structures formed by the tungsten layer 28 are then reencapsilated with dielectric material via an ozone TEOS process or a like inter-level dielectric (ILD) process.

The use of the metallic or conductive tungsten nitride etch stops has various advantages over the prior art. First, unlike plasma enhanced nitride (PEN) used as a contact etch structure in the prior art, conductive tungsten nitride is a superior etch stop with greater selectivity. Unlike PEN, tungsten nitride is conductive and need not be removed from the contact opening before plug formation. Since the layer 22 need not be removed from the contact structure, the underlying silicide regions 20 are always protected from contact etch processing. Therefore, contact resistance of the source and drain regions as well as the gate electrode regions are more consistent, and the silicide regions overlying the gate electrodes and shallow source and drain regions are not adversely effected by etch punch-through.

Furthermore, since the silicide regions 20 are protected by the conductive tungsten nitride layer 22 resulting in no silicide loss, no titanium resilicidation layer is needed within the contact structure barrier material as is typically used in the prior art Ti-containing barriers. In another words, in the embodiment taught herein, no titanium layer followed by a thermal cycle is needed to reform silicide regions which were previously effected by etch processing in the prior art structures. Therefore, no glue anneal process is required in FIGS. 1 through 7 to reform damaged silicide regions. In addition, the structure of FIG. 7 can be formed utilizing ultra shallow source and drain junctions which are roughly 0.1 microns or less in doping depth. These ultra shallow junctions were not capable of being performed in prior art devices due to the previously mentioned punch-through etch. Since the present invention involves no resilicidation of the source and drain regions or gate electrodes, the titanium nitride barrier regions and tungsten plugs are exposed to less stress as a result of volume expansions that occur in the prior art process from the Ti resilicidation process. Also, the deposition of plasma enhanced nitride (PEN) as an contact etch stop by the prior art introduces hydrogen into the transistor structures which can adversely effect threshold voltages of the transistors. Therefore, the use of a metallic etch stop to form integrated circuit (IC) contacts is superior over plasma enhanced nitride (PEN) etch stop prior art processes.

The invention can be further understood with reference to FIGS. 1 through 7.

FIGS. 1 through 7 illustrate in partial cross-sectional views a portion of semiconductor device as it is processed to form shallow source and drain junctions in accordance with one embodiment of the present invention. In FIG. 1, a semiconductor device 10 includes a semiconductor substrate 12 having current electrodes (source/drain regions) 14 formed therein. Between current electrodes 14 and overlying substrate 12, a gate electrode 16 is formed. Gate electrode 16 is separated from substrate 12 by a gate oxide 15. Sidewall spacers 18 are formed along the sidewalls of gate electrode 16. The sidewall spacers are typically formed from dielectric materials such as silicon nitride, and are used to enable formation of lightly doped drain (LDD) current electrodes 14 in a self-aligned manner.

Semiconductor device 10 also includes silicide regions 20 which are formed on the uppermost surfaces of current electrodes 14 and gate electrode 20. Silicide regions 20 are likewise formed in a self-aligned manner, wherein a refractory metal is blanketly deposited over the device, and this refractory metal layer, usually deposited by sputtering, is thermally reacted with exposed silicon or polysilicon regions to form silicide regions 20 as illustrated. Unreacted portions of the refractory metal are subsequently removed by an etch chemistry, leaving only the reacted silicide portions 20 illustrated in FIG. 1. As thus far described, semiconductor device 10 is manufactured in accordance with conventional practices. The various materials and processes used to form the devices thus far described are not important for the purposes of understanding the present invention, and therefore, will not be described in further detail.

Also shown in FIG. 1 is an etch stop layer 22 which is blanketly deposited over substrate 12, silicided regions 20, current electrodes 14, and gate electrodes 16. Etch stop layer 22 is formed of a conductive or metallic material, and is preferably formed of conductive tungsten nitride ($WN_x$). In accordance with the present invention, etch stop layer 22 can be deposited to a thickness in the range of 100–200 Å, using either physical vapor deposition techniques (PVD) or chemical vapor deposition techniques (CVD). The etch stop layer 22 electrically short-circuits all of the silicide regions together. These short circuits are either avoided by non-self-aligned photoresist patterning and etching in FIG. 1 or by self-aligned etch processing illustrated subsequently in FIG. 6.

Figure 2:
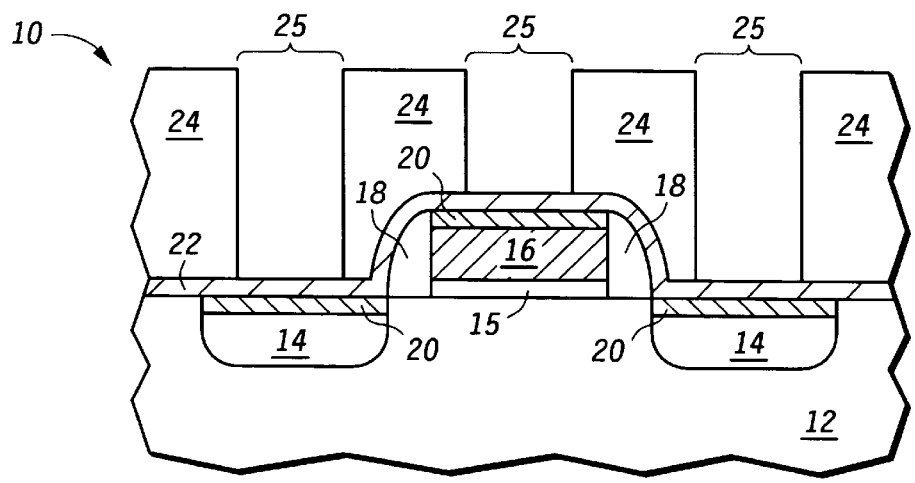

In FIG. 2, after depositing etch stop layer 22, the first level of interlayer dielectric material (ILD) is deposited over semiconductor device 10. In one form, the ILD layer deposited may be a doped borophosphosilicate glass (BPSG) deposited to a thickness of several thousand Angstroms. After deposition, the interlayer dielectric is patterned and etched as shown in FIG. 2 to form a plurality of contact openings. Interlayer dielectric 24 is etched to form local interconnects and/or contact openings over current electrodes 14 and gate electrode 16 using a reactive ion etch (RIE) or like plasma process. The etch chemistry used to create openings 25 is preferably a $C_4F_8/CF_4$ based etch chemistry. With this chemistry, openings 25 can be formed very selectively to etch stop layer 22, as shown in FIG. 2. The etch selectivity of etching BPSG relative to tungsten nitride using such a chemistry is at least 50:1. Therefore, the tungsten nitride layer 22 is a superior etch stop material from a selectivity perspective.

Because etch stop layer 22 is made of a conductive material, there is no need to remove the etch stop material from within openings 25 before making contacts or local interconnects in these openings. Since the layer 22 is thin, contact resistance is not adversely affected in order to achieve an adequate etch stop. Accordingly, there is no threat to punching through the underlying junctions. Accordingly, shallow junctions (having a vertical dimension of 0.1 microns or less) are enabled for practicing the present invention. Shallow junctions are needed to avoid known short channel effects that adversely affect modern transistors.

Figure 3:
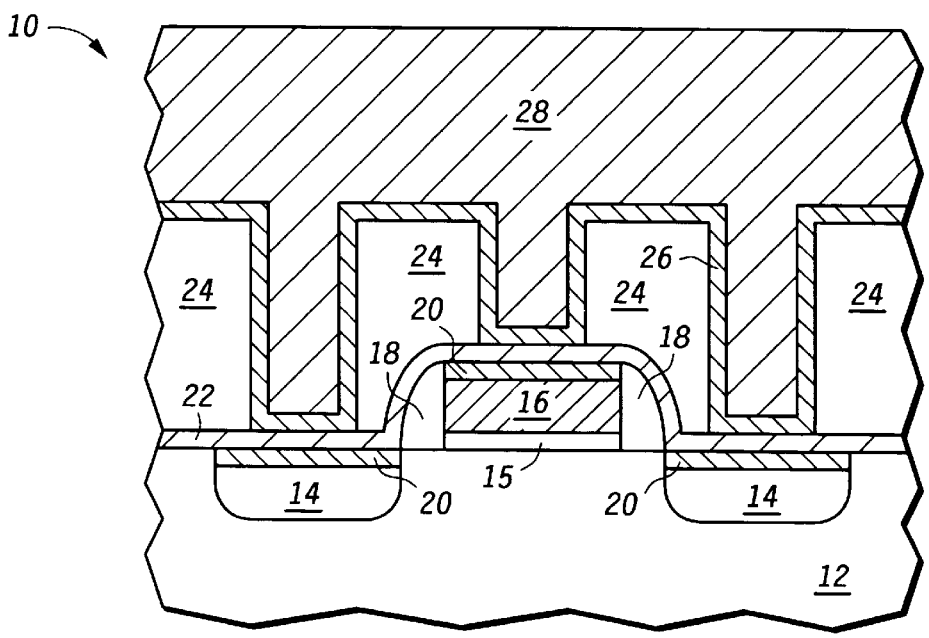

After forming openings 25 in FIG. 2, the local interconnect or contacts are then formed within the openings to provide the necessary electrical connections to the current electrodes 14 and gate electrode 16. As shown in FIG. 3, these connections are accomplished by depositing first a glue layer 26, such as a titanium nitride (TiN) layer, followed be deposition of a thicker conductive material 28 which fills the openings (usually formed as a tungsten (W) plug or like conductive metallic). In accordance with the present invention, the need for a titanium layer deposited prior to deposition of TiN glue layer 26 unnecessary. In prior art processes, a combination of titanium and titanium nitride were needed as a barrier/glue layer within openings 25. Titanium was needed to restore the titanium silicide regions at the bottom of the openings which may have been removed during punch-trough etching of the interlayer dielectric material and the prior art PEN etch stop. As an additional part of this restoration, the titanium layer had to be annealed to a temperature sufficient to form titanium silicide. This anneal step resulted in stress cracking in the contact regions due to the volume expansion that occurs during the reaction of Ti and Si to form titanium silicide. With the present invention, the need for a separately deposited titanium layer, and thus the need for a glue layer anneal, is eliminated, thereby resulting in an improved device with reduced stress cracking.

Figure 4:
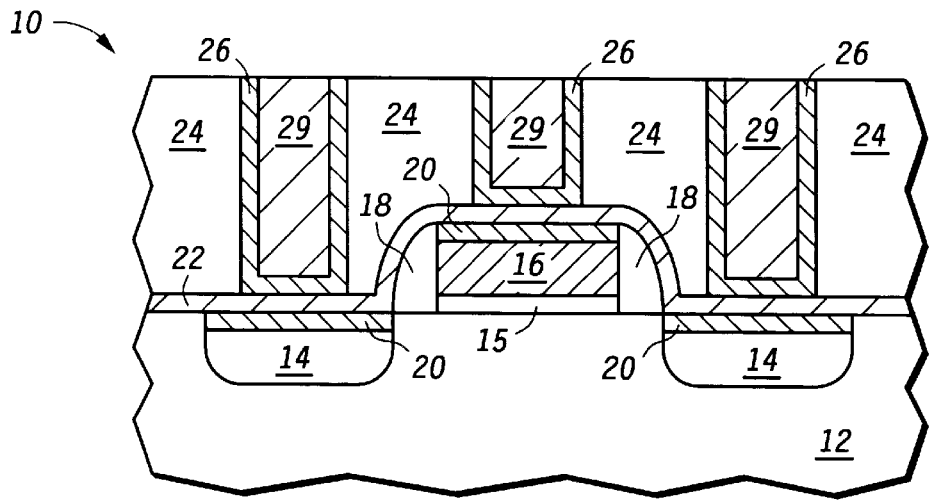

Conductive layer 28, in a preferred embodiment of the present invention, is a tungsten layer, deposited to a thickness sufficient to fill openings 25. Following deposition, device 10 is subjected to a chemical mechanical polishing (CMP) operation whereby conductive layer 28 and glue layer 26 are removed from device 10 in all areas other than within openings 25, as shown in FIG. 4. Conventional chemical/mechanical polishing (CMP) techniques can be used to achieve this polishing step. As a result of polishing, a plurality of conductive pillars/plugs 29 are formed.

Figure 5:
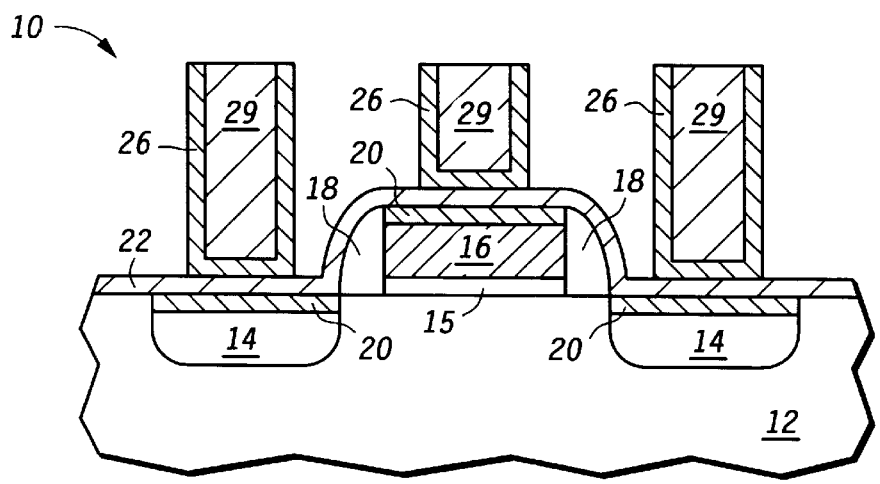

Following the formation of conductive pillars 29, semiconductor device 10 is subjected to an etch to remove interlayer dielectric 24. In a preferred embodiment, this etch is accomplished using a wet etch of dilute hydrofluoric:water mixture (100:1 to 400:1 mixture). Because such an etch is highly selective to conductive pillars 29 and underlying etch stop layer 22, use of a wet etch is preferred. Alternatively, a dry etch chemistry using one or more of $CHF_3/O_2$ or $CF_4$ can be used to remove interlayer dielectric 24. The result of removing interlayer dielectric 24 is that semiconductor device 10 now includes free standing conductive pillars 29, as shown in FIG. 5, which expose electrical short-circuiting portions of tungsten nitride layer 22. It is noted, that if using a dry etch to remove interlayer dielectric 24, sidewall spacers made of the interlayer dielectric material may be formed along the sidewalls of conductive pillars 29. In addition, spacers may be purposefully formed by TEOS or BPSG along the sidewall of the pillars 29 of FIG. 5 to improve protection of the layers 26 and 29 during subsequent layer 22 removal.

Figure 6:
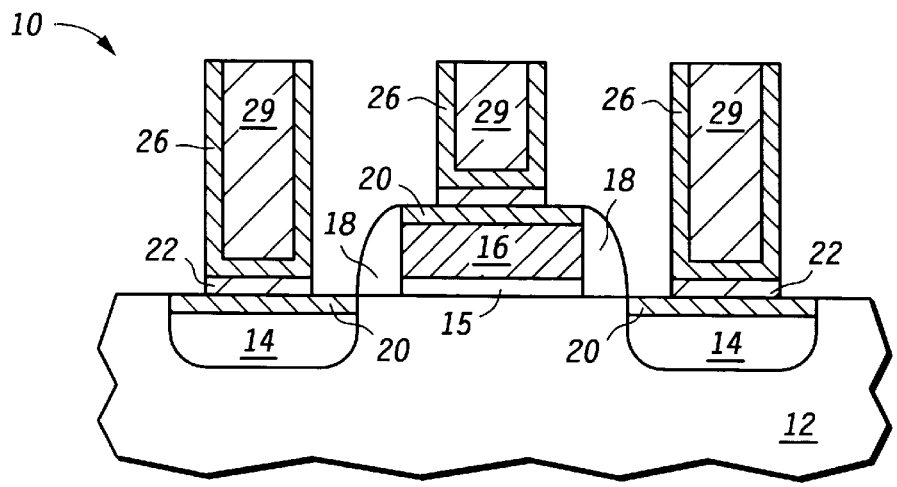

Following removal of interlayer dielectric 24, portions of etch stop layer 22 between the conductive pillars must be removed in order to achieve electrical isolation of the various conductive pillars. Removal of these portions of etch stop layer 22 is shown in FIG. 6. These portions may be removed by subjecting device 10 to a wet etch using a diluted hydrogen peroxide and an ammonium hydroxide chemistry (for example, a 1:1:50 ratio of hydrogen peroxide, ammonium hydroxide and water). Etching of a tungsten nitride layer using this $H_2O_2$, $NH_4OH$, and $H_2O$ chemistry can be performed without substantial removal of the tungsten or TiN respectively in conductive pillars 29 and layer 26. The etch selectivity of tungsten nitride to tungsten with this chemistry is about 5:1 and sidewall protection is significantly increased through use of the aforementioned dielectric sidewall spacer laterally adjacent layer 26 and pillars/plugs 29. Moreover, etch stop layer 22 is sufficiently thin, and conductive pillars 29 are sufficiently thick, that slight undercutting or removal of the tungsten from conductive pillars 29 during the removal of etch stop layer is not detrimental to the contact resistance or device performance.

Figure 7:
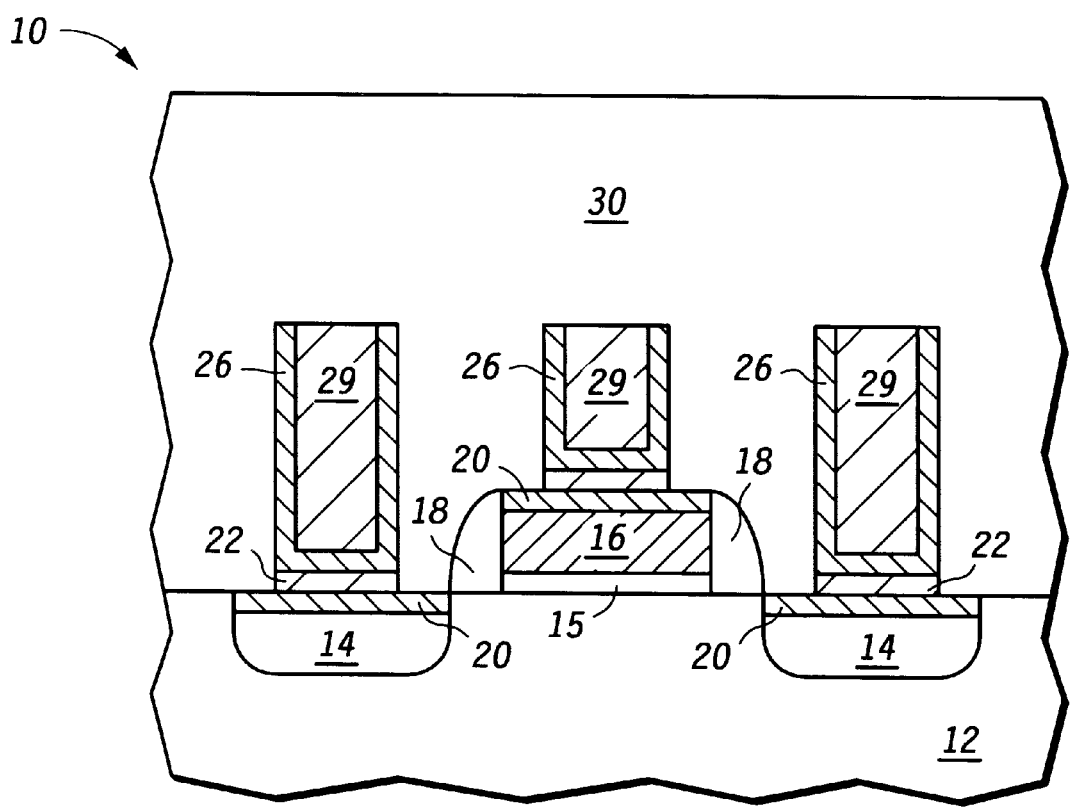

Once interconnecting portions of etch stop layer 22 have been removed in FIG. 6, a new interlayer dielectric 30 is deposited over device 10, as shown in FIG. 7. In a preferred embodiment of the present invention, interlayer dielectric 30 is a tetraethylorthosilicate (TEOS) based dielectric, which may be deposited in the presence of an ozone. After depositing interlayer dielectric 30, device 10 is polished (CMP) to planarize the interlayer dielectric. After planarization, contact openings can be formed in the interlayer dielectric 30, and the device can complete manufacturing in accordance with conventional practices.

Thus it is apparent that there has been provided, in accordance with the present invention, a method for forming ultra-shallow junction transistors using a metallic etch stop contact process. This device has: (1) improved ultra-shallow junction formation; (2) reduced hydrogen threshold affects; (3) reduced or eliminated punch-through damage; (4) no Ti resilicidation processing; (5) reduced or eliminated stress cracking in the pillars 29 and layer 26; and (6) more consistent contact resistance device-to-device. Although the invention has been described and illustrated with reference to the specific embodiment, it is not intended that the invention be limited to these illustrative embodiments. Those skilled in the art will recognize that modifications and variations may be made with departing from the spirit and scope of the invention. For example, other metallic etch stop materials may be used herein to obtain similar results. Therefore, it is intended that this invention encompass all variations and modifications as fall within the scope of the appended claims.

What is claimed is:

1. A method for forming a contact structure, the method comprising the steps of:

forming a silicide layer;

forming a tungsten nitride layer overlying the silicide layer;

forming a dielectric layer overlying the tungsten nitride layer;

etching a contact opening through the dielectric layer to expose a portion of the tungsten nitride layer wherein the tungsten nitride layer is used as an etch stop layer; and forming a conductive material within the contact opening and overlying the portion of the tungsten nitride layer to form an electrical contact to the silicide layer.

2. The method of claim 1 further comprising the steps of:

removing the dielectric layer after forming the conductive material within the contact opening, the removing being performed using a first etch chemistry that is selective to the conductive material and the tungsten nitride layer, the step of removing exposing a portion of the tungsten nitride layer that is not underlying the conductive material; and removing, using a second etch chemistry different from the first etch chemistry, the portion of the tungsten nitride layer not underlying the conductive material.

3. The method of claim 2 wherein the steps of removing comprise:

removing the dielectric layer using a dry etch chemistry as the first etch chemistry; and removing the portion of the tungsten nitride layer not underlying the conductive material using an isotropic etch process as the second etch chemistry.

4. The method of claim 2 wherein the steps of removing comprise:

removing the dielectric layer using a wet etch chemistry as the first etch chemistry; and removing the portion of the tungsten nitride layer not underlying the conductive material using an isotropic etch process as the second etch chemistry.

5. The method of claim 2 wherein the step of removing the tungsten nitride layer not underlying the conductive material comprises:

using an isotropic etch chemistry which comprises $H_2O_2$, $NH_4OH$, and $H_2O$ to remove the tungsten nitride layer not underlying the conductive material selective to the conductive material.

6. The method of claim 2 further comprising:

forming a sidewall spacer laterally adjacent a sidewall of the conductive material before removing the portion of the tungsten nitride layer not underlying the conductive material.

7. The method of claim 2 further comprising:

forming an ozone TEOS layer laterally adjacent the conductive material after the step of removing the portion of the tungsten nitride layer not underlying the conductive material.

8. The method of claim 1 wherein the step of forming the conductive material comprises:

forming the conductive material having a titanium nitride glue layer underlying a tungsten interconnect region.

9. The method of claim 1 further comprising:

removing portions of the tungsten nitride layer before the step of forming the dielectric layer.

10. A method for forming a contact structure, the method comprising the steps of:

providing a substrate;

forming a gate electrode overlying the substrate;

forming current electrodes within the substrate and laterally adjacent the gate electrode;

forming silicide regions overlying the gate electrode and the current electrodes;

forming a tungsten nitride etch stop layer overlying the silicide regions;

forming a first dielectric layer overlying the tungsten nitride etch stop layer;

forming contact openings through the first dielectric layer which expose first portions of the tungsten nitride etch stop layer which overly the silicide regions;

forming a conductive glue layer within the opening an in contact with the first portions of the tungsten nitride etch stop layer which overly the silicide regions;

forming a conductive plug region overlying the conductive glue layer and within the contact openings;

removing the first dielectric layer to expose second portions of the tungsten nitride etch stop layer which are different from the first portions of the tungsten nitride etch stop layer;

exposing the second portions of the tungsten nitride etch stop layer to an etch chemistry which comprises one or more of $H_2O_2$, $NH_4OH$, and $H_2O$ to remove the second portions of the tungsten nitride etch stop layer while not substantially removing the first portions of the tungsten nitride etch stop layer which overly the silicide regions; and forming a second dielectric layer overlying and laterally adjacent to the conductive plug region to insulate the conductive plug region.

11. The method of claim 10 wherein the first dielectric layer is formed as a borophosphosilicate (BPSG) layer.

12. The method of claim 10 wherein the step of removing the first dielectric layer comprises:

forming a sidewall spacer laterally adjacent the contact structure formed by the conductive plug region and the conductive glue layer to isolate the contact structure from the etch chemistry used to remove the second portions of the tungsten nitride etch stop layer.

13. The method of claim 10 wherein the second dielectric layer is formed at least in part as a layer of ozone tetraethylorthosilicate (TEOS) glass.

14. The method of claim 10 wherein the silicide regions are titanium silicide regions.

15. The method of claim 10 wherein the silicide regions are cobalt silicide regions.

16. The method of claim 10 current electrodes are shallow electrodes having a doping depth of less than 0.1 microns.

17. A method for forming a contact structure, the method comprising the steps of:

forming a gate electrode overlying a substrate;

forming source and drain electrodes adjacent the gate electrode and within the substrate;

forming silicide regions overlying the gate electrode and the source and drain electrodes;

forming a conductive metallic layer over the silicide regions so that the silicide regions are electrically short-circuited together;

forming a dielectric layer overlying the conductive metallic layer etching openings though the dielectric layer to expose first portions of the conductive metallic layer which overlie the silicide regions;

filling the opening with conductive material to form conductive contact regions;

removing the dielectric layer to expose second portions of the conductive metallic layer which are adjacent the first conductive portions of the conductive metallic layer; and removing the second portions of the conductive metallic layer so that the first and second portions of the conductive metallic layer are now electrically isolated from each other.

18. The method of claim 17 wherein the metallic layer is a tungsten nitride layer.

19. The method of claim 18 wherein the tungsten nitride layer has a thickness of less than 200 Angstroms.

* * * * *